US010360970B1

(12) United States Patent
Chang

(10) Patent No.: US 10,360,970 B1
(45) Date of Patent: Jul. 23, 2019

(54) STANDING AND RESONANT WAVE CLOCKING IN DDR RCD AND DATA BUFFER

(71) Applicant: Integrated Device Technology, Inc., San Jose, CA (US)

(72) Inventor: David Chang, Santa Clara, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/924,668

(22) Filed: Mar. 19, 2018

(51) Int. Cl.
G11C 11/40 (2006.01)
G11C 11/4076 (2006.01)
H03H 7/32 (2006.01)
G11C 11/4093 (2006.01)

(52) U.S. Cl.
CPC ...... *G11C 11/4076* (2013.01); *G11C 11/4093* (2013.01); *H03H 7/32* (2013.01)

(58) Field of Classification Search
CPC .... G11C 11/4076; G11C 11/4093; H03H 7/32
See application file for complete search history.

(56) References Cited

U.S. PATENT DOCUMENTS

2012/0311251 A1* 12/2012 Best ............... G06F 13/1689
711/105

* cited by examiner

*Primary Examiner* — Mohammed A Bashar
(74) *Attorney, Agent, or Firm* — Christopher P. Maiorana, PC

(57) ABSTRACT

An apparatus includes a plurality of termination points and a clock mesh network. The termination points may be configured to send/receive timing signals. Each of the termination points may comprise an inductor. The clock mesh network may be configured to provide a path to transmit the timing signals from a clock source to a plurality of components and implement a condition using the inductors. The inductors for each of the termination points may be implemented to meet the condition. Values for the inductors may be determined based on characteristics of the clock mesh network. The condition may prevent power loss.

15 Claims, 9 Drawing Sheets

US 10,360,970 B1

STANDING AND RESONANT WAVE CLOCKING IN DDR RCD AND DATA BUFFER

FIELD OF THE INVENTION

The invention relates to data transmission generally and, more particularly, to a method and/or apparatus for implementing standing and resonant wave clocking in DDR RCD and data buffer.

BACKGROUND

In double data rate fourth generation (DDR4) and fifth generation (DDR5) and other SerDes data communication, a memory interface (i.e., a registered clock driver or a data buffer) is a source of synchronous data transportation between the host central processing unit (CPU) and the synchronous dynamic random-access memory (SDRAM) modules. The source sync input clock and data are received and transmitted through the I/O pad. Through the clock path, more and more skew will be accumulated due to delay variation or mismatch. Furthermore, jitter will be accumulated from the thermal noise of various devices or system noise such as duty cycle variation, supply noise and spurs associated with the operating frequencies.

Conventional approaches to reduce jitter involve tuning and trimming the skew for each path to keep the skew within the specification margin. The amount of jitter is critical to the clock since the data rate is above 4.4 GHz. The tuning and trimming causes so much extra effort for the bench and Automatic Test Equipment (ATE) validation. Controlling the jitter is becoming more challenging with designs moving to DDR5.

It would be desirable to implement standing and resonant wave clocking in DDR RCD and data buffer.

SUMMARY

The invention concerns an apparatus comprising a plurality of termination points and a clock mesh network. The termination points may be configured to send/receive timing signals. Each of the termination points may comprise an inductor. The clock mesh network may be configured to provide a path to transmit the timing signals from a clock source to a plurality of components and implement a condition using the inductors. The inductors for each of the termination points may be implemented to meet the condition. Values for the inductors may be determined based on characteristics of the clock mesh network. The condition may prevent power loss.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing standing and resonant wave clocking in DDR RCD and data buffer that may (i) reduce an amount of skew in a clock network, (ii) reduce an amount of jitter in a clock network, (iii) implement inductor termination for a transmission line, (iv) reduce transmission line lengths within the constraints of a chip package, (v) recycle power between an inductance and a capacitance with a resonant wave to save power, (vi) be implemented at speeds that meet the DDR5 specification and/or (vii) be implemented as one or more integrated circuits.

Figure 1:
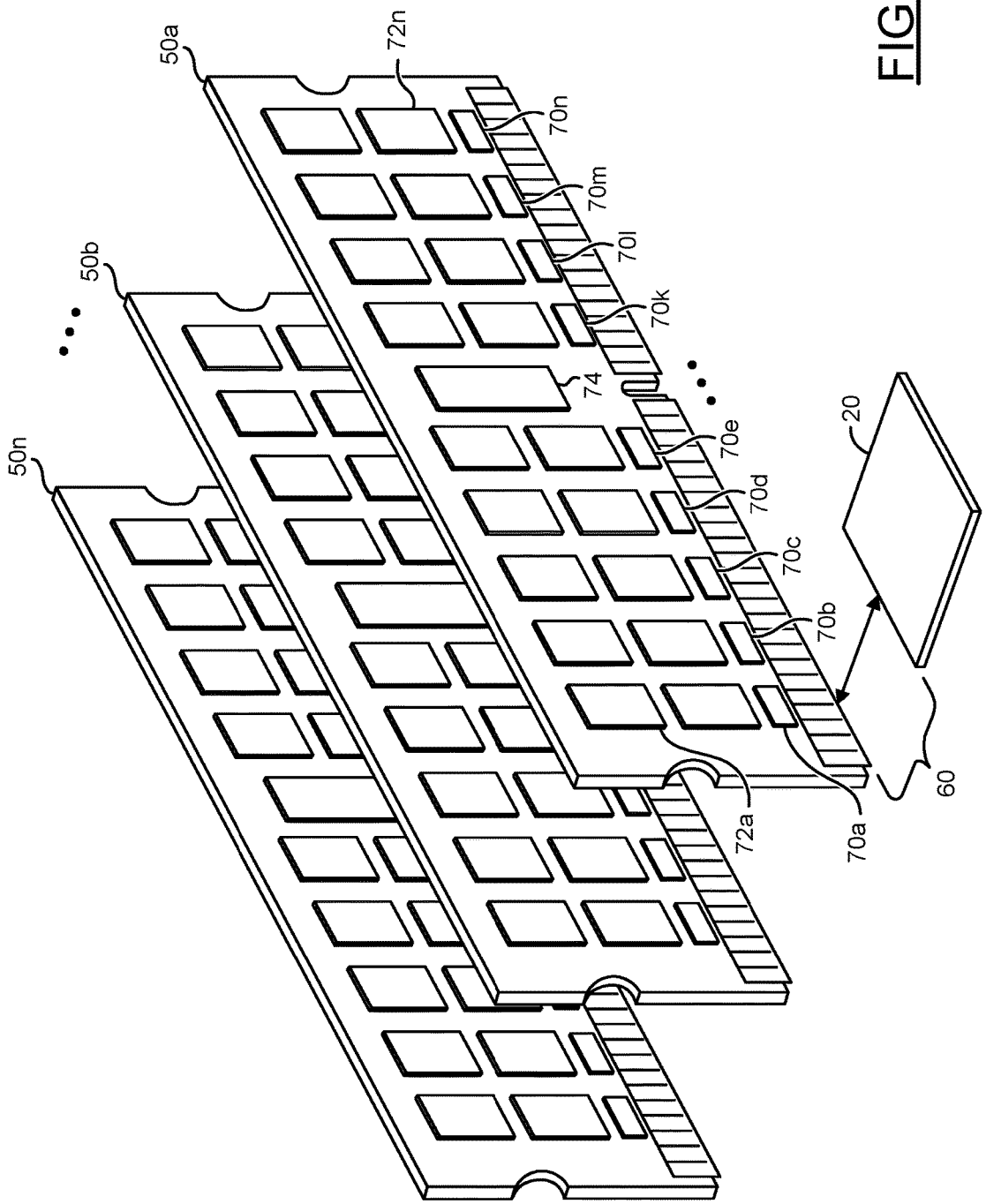
FIG. 1 is a diagram illustrating an example embodiment of a memory system.

Referring to FIG. 1, a diagram of a memory system is shown in accordance with an example embodiment of the invention. In various embodiments, the memory system includes a number of circuits 50a-50n. The circuits 50a-50n may be implemented as memory modules (or boards). In an example, the circuits 50a-50n may be implemented as dual in-line memory modules (DIMMs). In some embodiments, the circuits 50a-50n may be implemented as double data rate fourth generation (DDR4) synchronous dynamic random-access memory (SDRAM) modules. In some embodiments, the circuits 50a-50n may be implemented as double data rate fifth generation (DDR5) SDRAM modules.

In various embodiments, the circuits 50a-50n may comprise a number of blocks (or circuits) 70a-70n, a number of blocks (or circuits) 72a-72n, a block (or circuit) 74 and/or various other blocks, circuits, pins, connectors and/or traces. The circuits 70a-70n may be configured as data buffers. The circuits 72a-72n may implement memory devices. In an example, the circuits 72a-72n may be implemented as synchronous dynamic random-access memory (SDRAM) devices (or chips, or modules). The circuit 74 may be implemented as a registered clock driver (RCD). In an example, the RCD circuit 74 may be implemented as a DDR4 RCD circuit. In another example, the RCD circuit 74 may be implemented as a DDR5 RCD circuit. The type, arrangement and/or number of components of the memory modules 50a-50n may be varied to meet the design criteria of a particular implementation.

The memory modules 50a-50n are shown connected to a block (or circuit) 20. The circuit 20 may implement a memory controller. The circuit 20 may be located in another device, such as a computing engine. Various connectors/pins/traces 60 may be implemented to connect the memory modules 50a-50n to the memory controller 20. In some embodiments, the connectors/pins/traces 60 may be a 288- pin configuration. In an example, the memory controller 20 may be a component of a computer motherboard (or main board). In another example, the memory controller 20 may be a component of a microprocessor. In yet another example, the memory controller 20 may be a component of a central processing unit (CPU).

In an example, some of the connectors/pins/traces 60 may be part of the memory modules 50a-50n and some of the connectors/pins/traces 60 may be part of the motherboard and/or memory controller 20. The memory modules 50a-50n may be connected to the computer motherboard (e.g., by pins, traces and/or connectors 60) to transfer data between components of a computing device and the memory modules 50a-50n. In an example, the memory controller 20 may be implemented on a northbridge of the motherboard and/or as a component of a microprocessor (e.g., an Intel CPU, an AMD CPU, an ARM CPU, etc.). The implementation of the memory controller 20 may be varied according to the design criteria of a particular implementation.

In various embodiments, the circuits 50a-50n may be implemented as DDR4 (or DDR5) SDRAM memory modules. In an example, the circuits 50a-50n may have a memory module density of 512 gigabyte (GB), one terabyte (TB), or higher per module (e.g., compared to 128 GB per dual in-line memory module (DIMM) in DDR3). In embodiments implementing DDR4 SDRAM memory modules, the circuits 50a-50n may operate at voltages of 1.2-1.4 volts (V) with a frequency between 800-4266 megahertz (MHZ) (e.g., compared to 1.5-1.65V at frequencies between 400-1067 MHZ in DDR3). In embodiments, implementing DDR5 SDRAM memory modules, the circuits 50a-50n may operate with a frequency of 4.4 GHz, 6.6 GHz and/or higher frequencies. In some embodiments, the circuits 50a-50n may be implemented as low voltage DDR4 memory modules and operate at 1.05V. For example, in embodiments implementing low voltage DDR4 SDRAM memory modules, the circuits 50a-50n may implement 35% power savings compared to DDR3 memory. In embodiments implementing DDR4 SDRAM memory modules, the circuits 50a-50n may transfer data at speeds of 2.13-4.26 gigatransfers per second (GT/s) and higher (e.g., compared to 0.8-2.13 GT/s in DDR3). The operating parameters of the memory modules 50a-50n may be varied according to the design criteria of a particular implementation.

In an example, the memory modules 50a-50n may be compliant with the DDR4 specification entitled "DDR4 SDRAM", specification JESD79-4A, November 2013, published by the Joint Electron Device Engineering Council (JEDEC) Solid State Technology Association, Arlington, Va. Appropriate sections of the DDR4 specification (e.g., the JEDEC specification) are hereby incorporated by reference in their entirety. In another example, the memory modules 50a-50n may be implemented according to a fifth generation (DDR5) standard (e.g., for which a standard is currently under development by JEDEC).

The memory modules 50a-50n may be implemented as DDR4 load reduced DIMM (LRDIMM). The data buffers 70a-70n may allow the memory modules 50a-50n to operate at higher bandwidth and/or at higher capacities compared to DDR4 RDIMM (e.g., 2400 or 2666 MT/s for DDR4 LRDIMM compared to 2133 or 2400 MT/s for DDR4 RDIMM at 384 GB capacity). For example, compared to DDR4 RDIMM configurations, the DDR4 LRDIMM configuration of the memory modules 50a-50n may allow improved signal integrity on data signals and/or better intelligence and/or post-buffer awareness by the memory controller 20.

Figure 2:
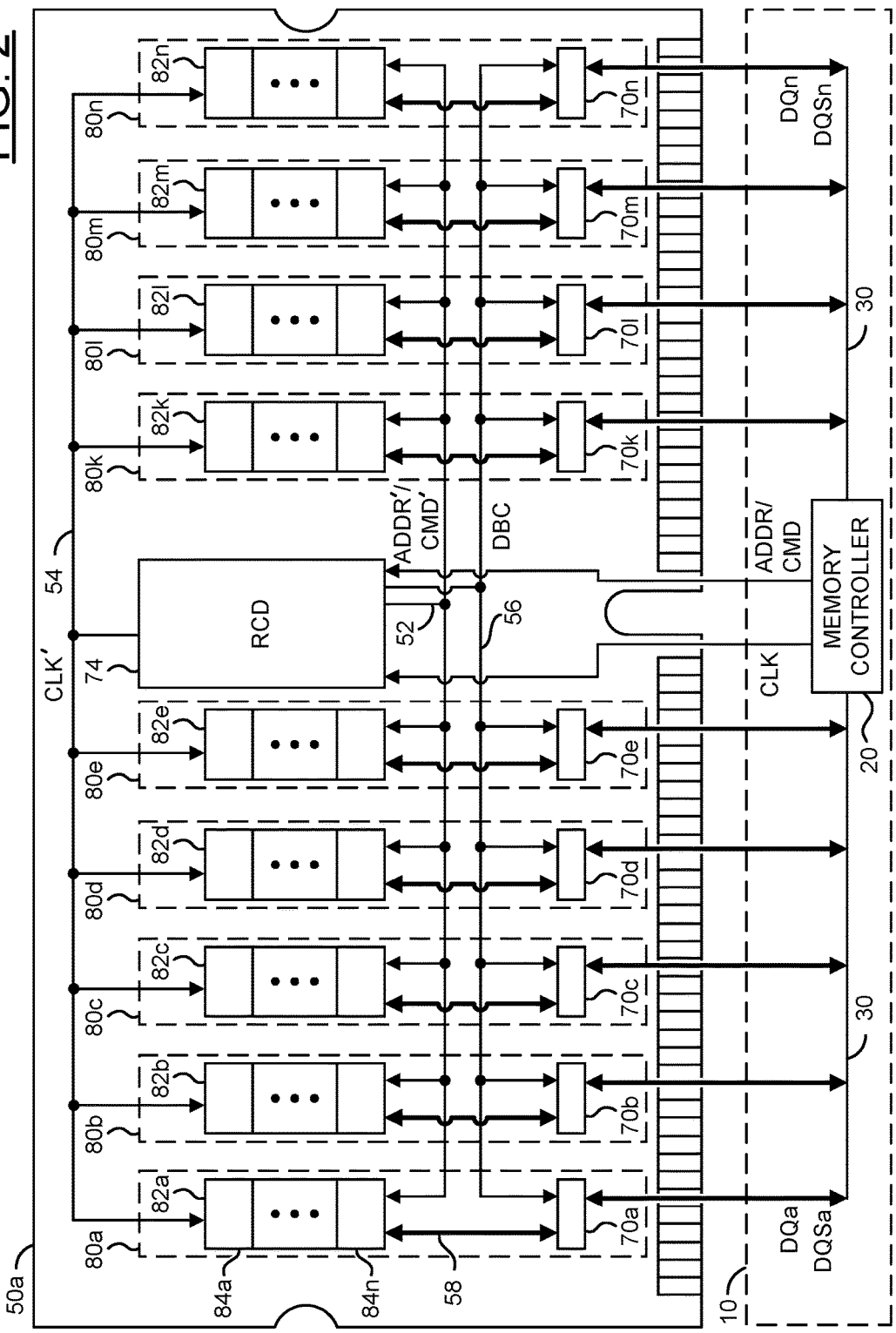
FIG. 2 is a block diagram illustrating a memory module of FIG. 1.

Referring to FIG. 2, a block diagram is shown illustrating a memory module 50a of FIG. 1. The memory module 50a may be representative of the memory modules 50b-50n. The memory module 50a is shown communicating with the memory controller 20. The memory controller 20 is shown as part of a block (or circuit) 10. The circuit 10 may be a motherboard (or main board), or other electronic component or computing engine that communicates with the memory module 50a.

The memory module 50a may comprise one or more blocks (or circuits) 80a-80n and/or the RCD circuit 74. The circuits 80a-80n may implement data paths of the memory module 50a. For example, the data path 80a may include a block 82a and/or the data buffer 70a. The data paths 80b-80n may have similar implementations. The circuits 82a-82n may each be implemented as a memory channel. Each of the memory channels 82a-82n may comprise a number of blocks (or circuits) 84a-84n. The circuits 84a-84n may be implemented as random access memory (RAM) chips. For example, the RAM chips 84a-84n may implement a volatile memory such as dynamic RAM (DRAM). The RAM chips 84a-84n may be the SDRAM devices 72a-72n (e.g., the chips 84a-84n may comprise one or more of the circuits 72a-72n located within one of the memory channels 82a-82n). In some embodiments, the RAM chips 84a-84n may be physically located on both sides (e.g., the front and back) of the circuit board of the memory modules 50a-50n. A capacity of memory on the memory module 50a may be varied according to the design criteria of a particular implementation.

The memory controller 20 may generate a signal (e.g., CLK) and a number of control signals (e.g., ADDR/CMD). The signal CLK and/or the signals ADDR/CMD may be presented to the RCD circuit 74. A data bus 30 may be connected between the memory controller and the data paths 80a-80n. The memory controller 20 may generate and/or receive data signals (e.g., DQa-DQn) and data strobe signals (e.g. DQSa-DQSn) that may be presented/received from the data bus 30. Portions of the signals DQa-DQn and DQSa-DQSn may be presented to respective data paths 80a-80n.

The RCD circuit 74 may be configured to communicate with the memory controller 20, the memory channels 82a-82n and/or the data buffers 70a-70n. The RCD circuit 74 may decode instructions received from the memory controller 20. For example, the RCD circuit 74 may receive register command words (RCWs). In another example, the RCD circuit 74 may receive buffer control words (BCWs). The RCD circuit 74 may be configured to train the DRAM chips 84a-84n, the data buffers 70a-70n and/or command and address lines between the RCD circuit 74 and the memory controller 20. For example, the RCWs may flow from the memory controller 20 to the RCD circuit 74. The RCWs may be used to configure the RCD circuit 74.

The RCD circuit 74 may be used in both LRDIMM and RDIMM configurations. The RCD circuit 74 may implement a 32-bit 1:2 command/address register. The RCD circuit 74 may support an at-speed bus (e.g., a BCOM bus between the RCD circuit 74 and the data buffers 70a-70n). The RCD circuit 74 may implement automatic impedance calibration. The RCD circuit 74 may implement command/address parity checking. The RCD circuit 74 may control register RCW readback. The RCD circuit 74 may implement a 1 MHz inter-integrated circuit ($I^2C$) bus (e.g., a serial bus). Inputs to the RCD circuit 74 may be pseudo-differential using external and/or internal voltages. The clock outputs, command/address outputs, control outputs and/or data buffer control outputs of the RCD circuit 74 may be enabled in groups and independently driven with different strengths.

The RCD circuit 74 may receive the signal CLK and/or the signals ADDR/CMD from the memory controller 20. Various digital logic components of the RCD circuit 74 may be used to generate signals based on the signal CLK and/or the signals ADDR/CMD and/or other signals (e.g., RCWs). The RCD circuit 74 may also be configured to generate a signal (e.g., CLK') and signals (e.g., ADDR'/CMD'). For example, the signal CLK' may be a signal Y_CLK in the DDR4 specification. The signal CLK' and/or the signals ADDR'/CMD' may be presented to each of the memory channels 82a-82n. For example, the signals ADDR'/CMD' and CLK' may be transmitted on a common bus 52 and a common bus 54, respectively. The RCD circuit 74 may generate one or more signals (e.g., DBC). The signals DBC may be presented to the data buffers 70a-70n. The signals DBC may implement data buffer control signals. The signals DBC may be transmitted on a common bus 56 (e.g., a data buffer control bus).

The data buffers 70a-70n may be configured to receive commands and data from the bus 56. The data buffers 70a-70n may be configured to generate/receive data to/from the bus 30. The bus 30 may comprise traces, pins and/or connections between the memory controller 20 and the data buffers 70a-70n. A bus 58 may carry the data between each of the data buffers 70a-70n and respective memory channels 82a-82n. The data buffers 70a-70n may be configured to buffer data on the buses 30 and 58 for write operations (e.g., data transfers from the memory controller 20 to the corresponding memory channels 82a-82n). The data buffers 70a-70n may be configured to buffer data on the buses 30 and 58 for read operations (e.g., data transfers from the corresponding memory channels 82a-82n to the memory controller 20).

The data buffers 70a-70n may exchange data with the DRAM chips 84a-84n in small units (e.g., 4-bit nibbles). In various embodiments, the DRAM chips 84a-84n may be arranged in multiple (e.g., two) sets. For two set/two DRAM chip (e.g., 84a-84b) implementations, each set may contain a single DRAM chip (e.g., 84a or 84b). Each DRAM chip 84a-84b may be connected to the respective data buffers 70a-70n through an upper nibble and a lower nibble. For two set/four DRAM chip (e.g., 84a-84d) implementations, each set may contain two DRAM chips (e.g., 84a-84b or 84c-84d). A first set may be connected to the respective data buffers 70a-70n through the upper nibble. The other set may be connected to the respective data buffers 70a-70n through the lower nibble. For two set/eight DRAM chip (e.g., 84a-84h) implementations, each set may contain four of the DRAM chips 84a-84h. A set of four DRAM chips (e.g., 84a-84d) may connect to the respective data buffers 70a-70n through the upper nibble. The other set of four DRAM chips (e.g., 84e-84h) may connect to the respective data buffers 70a-70n through the lower nibble. Other numbers of sets, other numbers of DRAM chips, and other data unit sizes may be implemented to meet the design criteria of a particular implementation.

The DDR4 LRDIMM configuration may reduce a number of data loads to improve signal integrity on a data bus (e.g., the bus 30) of the memory module from a maximum of several (e.g., four) data loads down to a single data load. The distributed data buffers 70a-70n may allow DDR4 LRDIMM designs to implement shorter I/O trace lengths compared to DDR3 LRDIMM designs, which use a centralized memory buffer. For example, shorter stubs connected to the memory channels 82a-82n may result in less pronounced signal reflections (e.g., improved signal integrity). In another example, the shorter traces may result in a reduction in latency (e.g., approximately 1.2 nanoseconds (ns), which is 50% less latency than DDR3 buffer memory). In yet another example, the shorter traces may reduce I/O bus turnaround time. For example, without the distributed data buffers 70a-70n (e.g., in DDR3 memory applications) traces would be routed to a centrally located memory buffer, increasing trace lengths up to six inches compared to the DDR4 LRDIMM implementation shown in FIG. 2.

In some embodiments, the DDR4 LRDIMM configuration may implement nine of the data buffers 70a-70n. The memory modules 50a-50n may implement 2 millimeter (mm) frontside bus traces and backside traces (e.g., the connectors/pins/traces 60). A propagation delay through the data buffers 70a-70n may be 33% faster than through a DDR3 memory buffer (e.g., resulting in reduced latency). In some embodiments, the data buffers 70a-70n may be smaller (e.g., a reduced area parameter) than a data buffer used for DDR3 applications.

Figure 3:
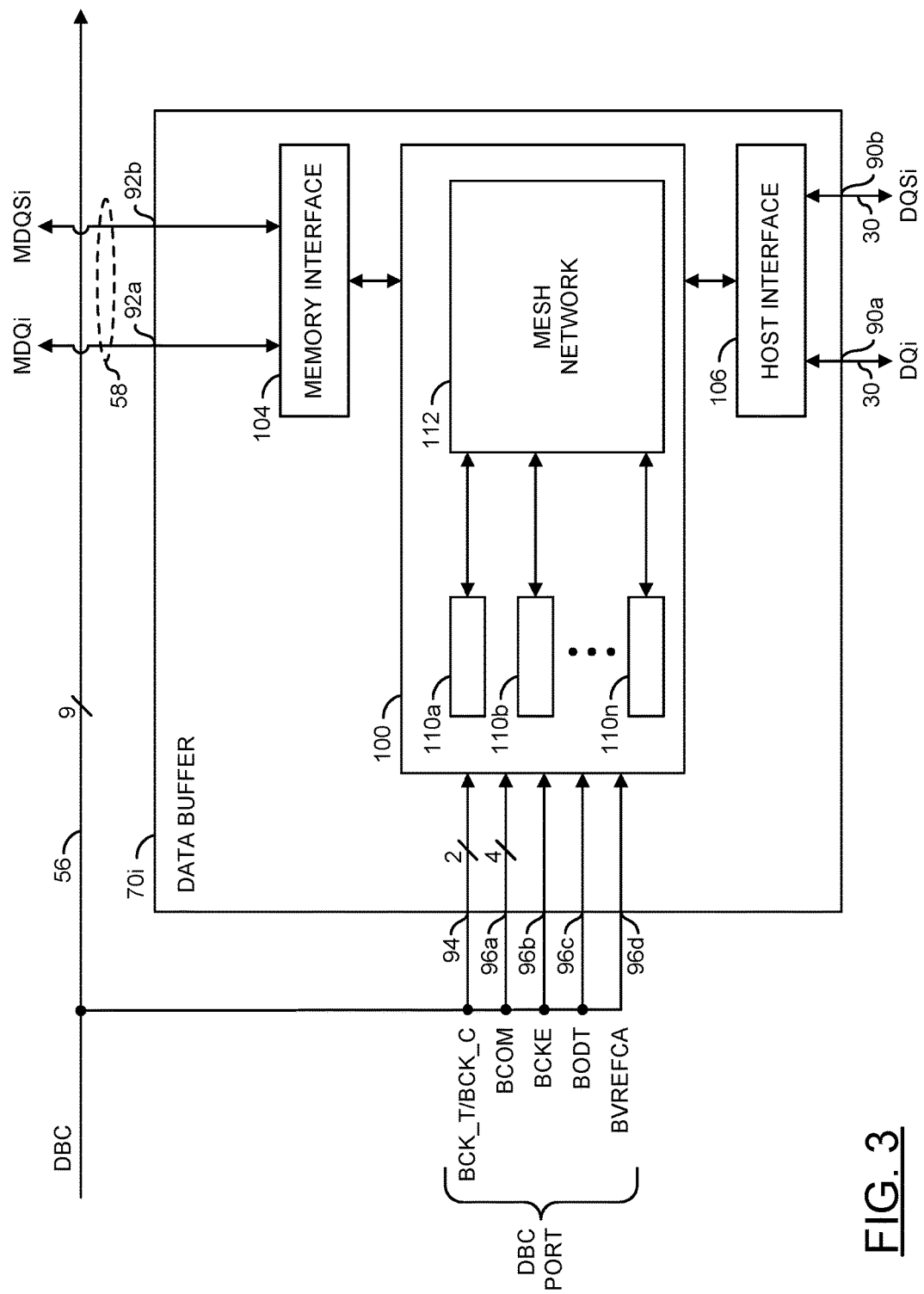
FIG. 3 is a block diagram illustrating an example data buffer of FIG. 1.

Referring to FIG. 3, a diagram is shown illustrating a data buffer 70i in accordance with an example embodiment of the invention. The data buffer 70i may be representative of an example embodiment of the data buffers 70a-70n. The data buffer 70i is shown having a first input/output 90a, a second input/output 90b, a third input/output 92a and a fourth input/output 92b.

The first input/output 90a is configured for presenting/receiving the signals DQi (e.g., the data signals DQ corresponding to a memory channel) between the data buffer 70i and the controller 20. The second input/output 90b is configured for presenting/receiving the signals DQSi (e.g., the data strobe signals DQS corresponding to the memory channel) between the data buffer 70i and the controller 20. The third input/output 92a is configured for presenting/receiving the signals DQi as memory input/output signals (e.g., MDQi) corresponding to a memory channel between the data buffer 70i and the respective memory devices (e.g., DRAM chips) 72a-72n. The fourth input/output 92b is configured for presenting/receiving the signals DQSi as memory input/output signals (e.g., MDQSi) corresponding to a memory channel between the data buffer 70i and the respective memory devices (e.g., DRAM chips) 72a-72n.

The signals MDQi and/or MDQSi are generally transmitted between the memory modules 72a-72n and the respective data buffer 70a-70n. In an example, data (e.g., the signals DQi) and/or a data strobe (e.g., the signal DQSi) from the memory controller 20 may be presented to the data buffer 70i, buffered in the data buffer 70i, then transmitted to the respective memory device(s) 72a-72n. In another example, data from the respective memory device(s) 72a-72n (e.g., MDQi) and/or a data strobe (e.g., the signal MDQSi) may be presented to the data buffer 70i, buffered in the data buffer 70i, and then transmitted on an appropriate memory channel to the memory controller 20.

The data buffer 70i is shown also receiving signals (e.g., DBC) from the bus 56 at a control port (e.g., DBC PORT). The signals DBC may be presented to the data buffers 70a-70n (e.g., using the data buffer control bus 56). In an example, the signals DBC are illustrated comprising five signals transmitted over 9 pins/bits (e.g., a pair of signals BCK_T/BCK_C, a signal BCOM, a signal BCKE, a signal BODT and/or a signal BVREFCA). However, other numbers of pins/bits may be implemented accordingly to meet the design criteria of a particular application. The control port of the data buffer 70i is shown having an input 94 receiving the signals BCK_T/BCK_C, an input 96a receiving the signal BCOM, an input 96b receiving the signal BCKE, an input 96c receiving the signal BODT, and an input 96d receiving the signal BVREFCA.

In various embodiments, the signals BCK_T/BCK_C may be implemented as a 2-bit signal representing a differential (e.g., true (T) and complementary (C) versions) clock signal for the duplex data buffers 70a-70n. In an example, the signals BCK_T/BCK_C may represent a system clock. In various embodiments, the signal BCOM may be implemented as a 4-bit signal representing data buffer commands. However, other numbers of bits may be implemented accordingly to meet the design criteria of a particular application. The signal BCOM may be implemented as a unidirectional signal from the RCD circuit 74 to the data buffers 70a-70n. In an example, the signal BCOM may be implemented at a single data rate (e.g., 1 bit per signal per clock cycle). However, a particular command may take a different number of clock cycles to transfer information. The signal BCKE may be a function registered dedicated non-encoded signal (e.g., DCKE). The signal BODT may be a function registered dedicated non-encoded signal (e.g., DODT). The signal BVREFCA may be a reference voltage for use with pseudo-differential command and control signals.

The data buffers 70a-70n may receive a set of data buffer commands (e.g., for writing buffer control words (BCWs)) from the signals DBC. The buffer control words may be used to customize operation of the data buffers 70a-70n. The buffer control words may flow from the memory controller 20, through the RCD circuit 74, to the data buffers 70a-70n. The buffer control words may be similar to register control words (RCWS) used for configuring the RCD circuit 74. Similar to commands for writing the register control words, the commands for writing the buffer control words may look like an MRS7 command, where the address lines are really the payload.

In embodiments where the bus 56 comprises nine pins, the RCD circuit 74 may do more than pass a buffer control word directly through to the data buffers 70a-70n. In one example, the RCD circuit 74 may convert (e.g., multiplex) an MRS7 command format into a buffer control word in a BCOM format. The RCD circuit 74 may map the 12 address bits of the MRS7 command into five separate data transfers, each 4 bits wide. The five data transfers may be set up back to back over the bus 56. For example, 5 clock cycles plus a parity cycle may be used to complete the buffer command in the buffer control word. Once the buffer control word reaches the data buffers 70a-70n, the data buffers 70a-70n may decode the buffer control word, write the buffer control word to a function space of the data buffer, and complete the buffer command in the buffer control word.

A function of the signal BCOM may be to transmit the buffer control words. However, compliant with the JEDEC specification for DDR4 SDRAM, the RCD circuit 74 may send all read/write commands and MRS information over the bus 56 (e.g., to allow the data buffers 70a-70n to keep track of what the memory devices 72 are doing). In some embodiments, different buffer commands may take a different number of cycles to transfer the information.

The RCD circuit 74 may receive an MRS7 command from the memory controller 20 (e.g., from a host). For example, a host may want to change a parameter (e.g., typically on initialization or boot up of a computing device). The RCD circuit 74 may check the MRS7 command to determine whether the address bit 12 is set to 1 (e.g., a logical one). In an example, when an address bit 12 of the MRS7 command is set to 1, the RCD circuit 74 may recognize the command as a buffer command (e.g., a command that is not meant for the RCD circuit 74). The RCD circuit 74 may convert the command from the memory controller 20 to a buffer control word and send the buffer control word to the data buffers 70a-70n via the bus 56. The data buffers 70a-70n may write the buffer control word to a function space to complete the command.

The data buffers 70a-70n may be configurable. The buffer commands may allow the memory controller 20 to customize aspects of termination (e.g., ODT), signal strength on the DQ lines, and/or events (e.g., receiver timing, driver timing, etc.) in both directions (e.g., for both read and write operations). In some embodiments, some of the configurations of the data buffers 70a-70n may be decided based on system level configurations. Generally, most of the configuration of the data buffers 70a-70n may be decided during training steps. During training steps, host controllers (e.g., the memory controller 20) may test and compare results of various training steps to determine an optimal configuration.

In various embodiments, the bus 56 may be used to send commands/data to program configuration registers of the data buffers 70a-70n. The bus 56 may also send commands (e.g., data reads and/or data writes) that control data traffic through the data buffers 70a-70n. For example, some commands may optimize power consumption and noise filtering (e.g. equalization) of the data buffers 70a-70n. In another example, read/write delays may be added per data line.

The data buffers 70a-70n may implement dual multi-bit (e.g., 4-bit) bi-directional data registers with differential data strobes (e.g., DQS_T/DQS_C). The data buffers 70a-70n may implement automatic impedance calibration. The data buffers 70a-70n may implement BCOM parity checking. The data buffers 70a-70n may implement control register (e.g., buffer control word) readback.

In some embodiments, the data buffers 70a-70n may comprise a block (or circuit or module or apparatus) 100. The circuit 100 implemented in one or more of the data buffers 70a-70n may be configured to implement a standing wave and/or resonant wave clocking architecture in a double data rate (DDR) memory system. In one example, the circuit 100 may be configured to inhibit (e.g., avoid, resist, prevent, reduce) an accumulation of skew through the clock path (e.g., skew caused by delay variation, and/or mismatch). Skew may be a result of clock pulses arriving at different areas of a chip at different times. In another example, the circuit 100 may be configured to inhibit jitter (e.g., accumulated from thermal noise of the devices and/or system noise such as duty cycle variation, supply noise and/or spurs associated with the operating frequencies). Jitter may be a result of inconsistent time between two clock pulses.

In the example shown, the circuit 100 may be configured to connect to a block (or circuit) 104 and/or a block (or circuit) 106. The circuit 104 may implement a memory interface. The circuit 106 may implement a host interface. The circuit 100 may comprise and/or connect to other components and/or circuits (not shown). The number and/or type of components and/or the signals transmitted between the circuits may be varied according to the design criteria of a particular implementation.

The apparatus 100 may comprise a number of blocks (or circuits) 110a-110n and/or a block (or circuit) 112. The blocks 110a-110n may implement termination points. For example, the termination points 110a-110n may be configured to send and/or receive timing signals (e.g., an internal clock signal, the signal(s) BCK_T/BCK_C, etc.). The block 112 may implement a network mesh. In an example, the network mesh 112 may be a clock mesh network configured to provide a path to transmit timing signals from a clock source to various components (e.g., components of the data buffer 70i). The apparatus 100 may comprise other components (not shown). The number, type and/or arrangement of the components of the apparatus 100 may be varied according to the design criteria of a particular implementation.

Figure 4:
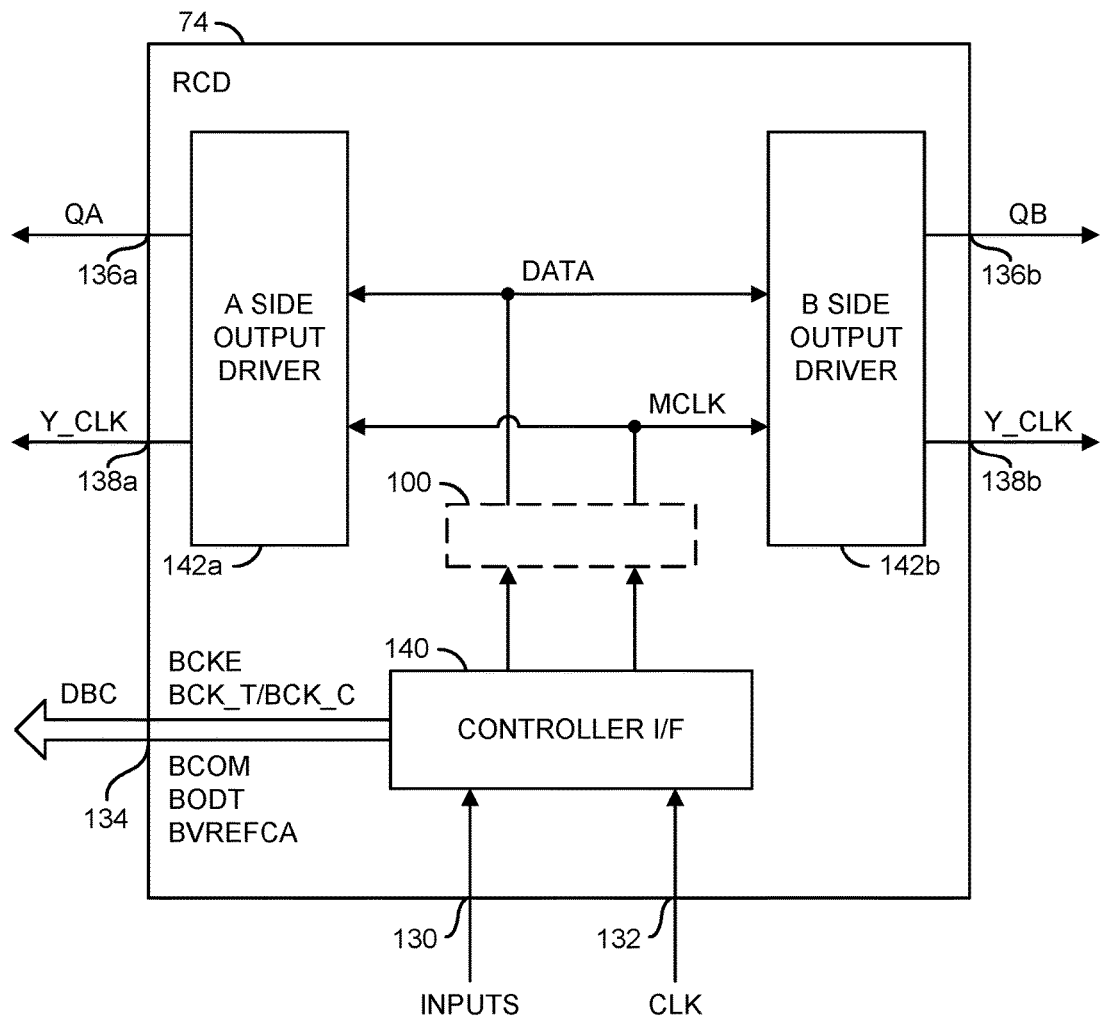
FIG. 4 is a diagram illustrating a registered clock driver (RCD) in accordance with an embodiment of the invention.

Referring to FIG. 4, a diagram is shown illustrating a registered clock driver in accordance with an embodiment of the invention. In various embodiments, a circuit 74 may implement a registered clock driver circuit (or chip). In various embodiments, the circuit 74 may be JEDEC compliant (e.g., compliant with the DDR4 specification entitled "DDR4 SDRAM", specification JESD79-4A, November 2013, published by the Joint Electron Device Engineering Council (JEDEC) Solid State Technology Association, Arlington, Va. and/or compliant with the DDR5 standard).

The circuit 74 may have an input 130 that receives input data (e.g., INPUTS), an input 132 that receives the clock signal CLK, an input/output 134 that may receive/transmit control information (e.g., DBC), outputs 136a and 136b that may provide data outputs (e.g., the Q outputs QA and QB, respectively) and outputs 138a and 138b that may provide output clock signals (e.g., Y_CLK). The signals INPUTS and CLK may be received from a memory controller (e.g., the memory controller 20 in FIG. 1) via a memory bus of a motherboard. In an example, the signals INPUTS may be pseudo-differential using an external or internal voltage reference. The signals INPUTS may comprise the ADDR/CMD signals of FIGS. 1 and 2. In an example, the signal CLK may be implemented as differential clock signals CLK_t (true) and CLK_c (complement). The signals QA, QB, and Y_CLK may be presented to a number of memory chips (e.g., 84a-84n in FIG. 2). For example, the signals QA, QB and Y_CLK may implement an output address and control bus for a DDR4 RDIMM, DDR4 LRDIMM, DDR4 UDIMM and/or DDR5 memory module. The signal DBC may be implemented as a data buffer control bus.

In various embodiments the circuit 74 may comprise a block 140, a block (or circuit) 142a and/or a block (or circuit) 142b. The block 140 may implement a controller interface. The blocks 142a and 142b may implement output driver circuits. In some embodiments, the blocks 142a and 142b may be combined as a single circuit 142. The block 140 may be configured to generate a data signal (e.g., DATA) and a clock signal (e.g., MCLK). The block 140 may be configured to generate the pair of signals BCK_T/BCK_C, the signal BCOM, the signal BCKE, the signal BODT and/or the signal BVREFCA. The signals DATA and MCLK may be presented to the blocks 142a and 142b. In various embodiments, the signal DATA may be coupled to the blocks 142a and 142b by combinatorial logic (not shown). The blocks 142a and 142b may be configured to generate the signals QA, QB and Y_CLK.

In various embodiments, the circuit 74 may be enabled to automatically adjust a skew time of a plurality of output pins during a manufacturing test operation. In various embodiments, the circuit 74 may be enabled to adjust the skew time (e.g., tSkew) to within a single gate delay of a reference output clock. As used herein, the term tSkew may be defined as the phase difference between an output data signal or pin (e.g., Q) and an output clock signal or pin (e.g., Y_CLK). In an example, a DDR4 registered clock driver (RCD) may have sixty-six output pins. However, other numbers of output pins may be implemented to meet the design criteria of a particular implementation (e.g., a DDR5 implementation).

The circuit 74 may be configured to adjust the phase of the output pins relative to the clock signal Y_CLK (or to respective copies of the clock signal Y_CLK) to meet manufacturer specifications (e.g., within +/−50 ps, etc.). The granularity of the phase adjustment is generally determined by delay elements within the circuit 74. During production testing, the circuit 74 may be configured to perform a trimming process in response to signals from automated test equipment and provide a pass/fail indication to the automated test equipment. In various embodiments, the circuit 74 may be utilized to implement the RCD in DDR4 RDIMM, DDR4 LRDIMM, DDR4 UDIMM and/or DDR5 memory modules.

In some embodiments, the RCD circuit 74 may comprise the circuit 100. In some embodiments, the circuit 100 may be implemented wholly or partially within the circuit 140, the circuit 142a and/or the circuit 142b. In some embodiments, the RCD circuit 74 may implement multiple instances of the circuit 100 (e.g., one implemented within the circuit 142a and another implemented within the circuit 142b). In some embodiments, the circuit 100 may be implemented as a component separate from the other components of the RCD 74. The circuit 100 implemented within the RCD circuit 74 may be configured to implement a standing wave and/or resonant wave clocking architecture in a double data rate (DDR) memory system. Details of the circuit 100 may be described in association with FIGS. 5-14.

Figure 5:
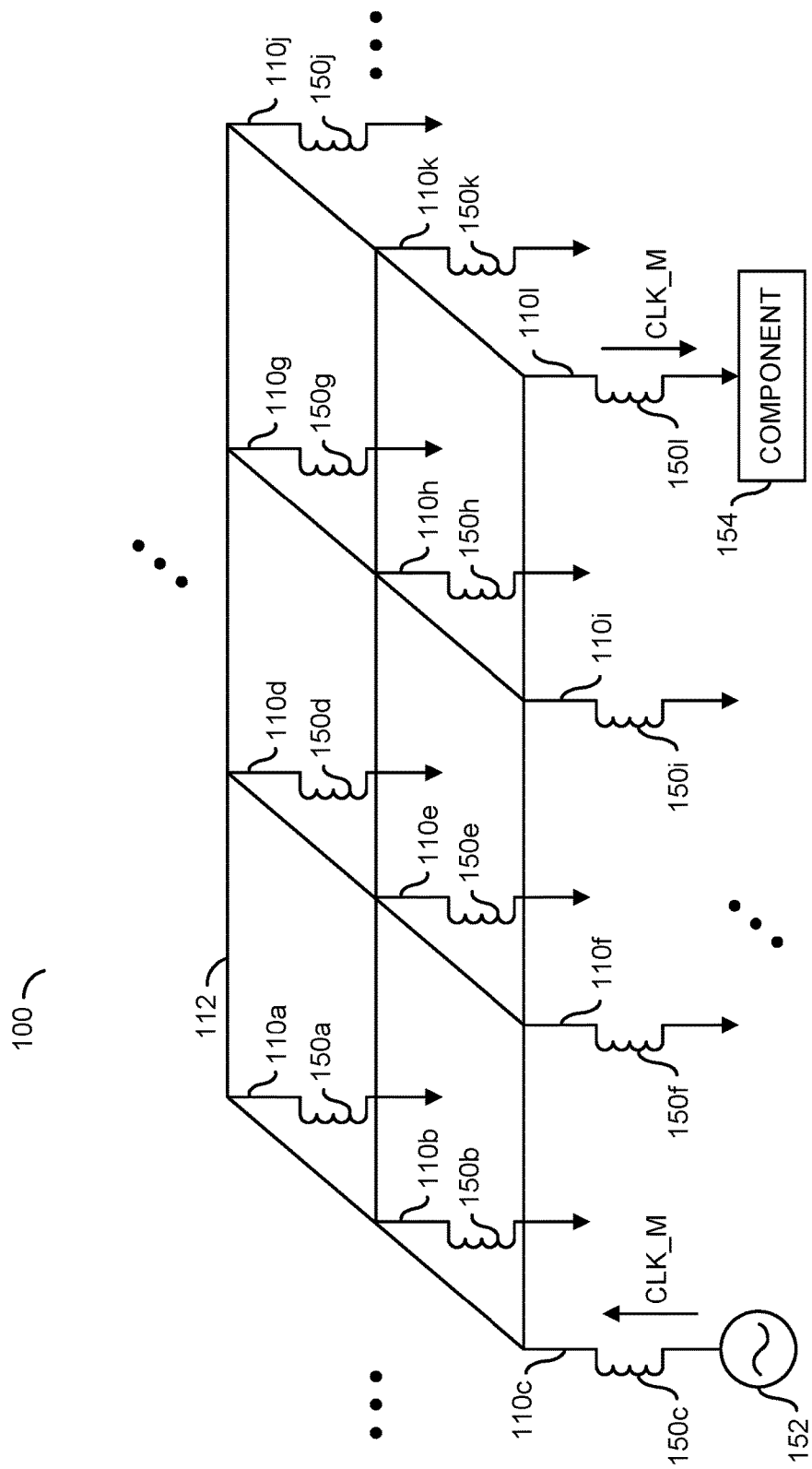
FIG. 5 is a diagram illustrating a clock mesh with inductor termination.

Referring to FIG. 5, a diagram illustrating the clock mesh 112 with inductor terminations 110a-110n is shown. An example portion of the apparatus 100 is shown. The apparatus 100 may be implemented as part of a memory interface. The portion of the apparatus 100 shown may comprise a number of termination points 110a-110l. The termination points 110a-110l may each be connected to the clock mesh network 112. In one example, the apparatus 100 may be implemented in and/or across one or more of the data buffers 70a-70n. In another example, the apparatus 100 may be implemented in and/or across the RCD 74. The size of the apparatus 100 may be constrained by the size of the circuit package and/or fabrication technology (e.g., the size of the circuit package for the data buffers 70a-70n and/or the RCD 74 may be approximately 5 mm×5 mm). The number and/or arrangement of the termination points 110a-110l and/or the size of the clock mesh 112 may be varied according to the design criteria of a particular implementation.

Each of the termination points 110a-110l may comprise a corresponding inductor 150a-150l. Each of the termination points 110a-110l may comprise other circuitry (e.g., a resistance, a parasitic capacitance, mesh buffers, etc.) and/or logic (not shown). Each of the inductors 150a-150l may be implemented to enable the apparatus 100 to meet a condition. In one example, the condition may be a standing wave condition. In another example, the condition may be a resonant wave condition. The value and/or characteristics of the inductors 150a-150l may be implemented based characteristics of the other circuitry at the termination points 110a-110l, characteristics of the clock mesh network 112, a clock frequency, chip size requirements and/or design goals for the data buffers 70a-70n and/or the RCD 74 (e.g., jitter reduction, power savings, etc.). Implementing the inductors 150a-150l at the termination points 110a-110l (e.g., inductor termination) may enable a transmission line length for the clock mesh network 112 to be reduced (e.g., compared to ground termination).

In the example shown, one of the termination points 110c may comprise a block (or circuit) 152. The block 152 may implement a clock source. The clock source is shown generating a signal (e.g., CLK_M). The signal CLK_M may be a timing signal for the clock mesh network 112. For example, the termination point 110c may send the timing signal CLK_M to the clock mesh network 112. The clock mesh network 112 may transmit the timing signal CLK_M from the clock source 152 to each of the termination points 110a-110l. In some embodiments, the clock source 152 may be added in the middle of the chip. However, implementing the clock source 152 as an input at one of the inductors 150a-150l may enable the apparatus 100 to meet the resonant wave condition. The resonant wave condition may be determined by the transmission length.

In the example shown, one of the termination points 110l may comprise a block (or circuit) 154. The block 154 may represent one of a plurality of components. In the example shown, only the component 154 is shown for clarity. Generally, each of the termination points 110a-110n may connect to one or more of the components 154. The clock mesh 112 may provide a path to transmit the timing signals CLK_M (e.g., from the termination points 110c) to the components 154 (e.g., to the termination point 110l, in the example shown).

The clock mesh network 112 may be configured to deliver the timing signals to each of the components 154. The location of the components 154 may follow the clock mesh network 112 to enable the components 154 to take the timing signals from the closest and/or most convenient one of the termination points 110a-110n. The clock mesh network 112 may globally deliver the timing signals throughout the chip package (e.g., the data buffers 70a-70n and/or the RCD 74) and the components 154 may pick up the timing signals from a nearby area.

In some embodiments, the apparatus 100 may implement multiple frequencies for the timing signals. When implementing multiple frequencies for the timing signals (e.g., more than one timing signal), multiple different clocking mesh networks 112 may be implemented. The standing wave and/or resonant wave condition may be implemented on each of the clock mesh networks 112.

The apparatus 100 may be configured to provide a solution to reduce and/or eliminate skew and/or jitter from the clock tree 112 in the design of the RCD 74 and/or the data buffers 70a-70n. For example, the amount of jitter becomes critical to the clock signal since the data rate may be greater than 4.4 GHz. Reducing jitter may be more challenging with the design of the memory modules 50a-50n moving to DDR5.

Implementing the apparatus 100 to meet the standing wave condition and/or the resonant wave condition may significantly reduce clock jitter. Implementing the apparatus 100 to meet the standing wave condition and/or the resonant wave condition may significantly reduce skew caused through the clock tree and clocking path (e.g., the clock mesh network 112). The apparatus 100 may not need to meet both the standing wave condition and the resonant condition. Implementing at least one condition (e.g., at least one of the standing wave condition and the resonant wave condition) may improve the skew and jitter performance metric. In one example, the apparatus 100 may be configured to meet the standing wave condition. In another example, the apparatus 100 may be configured to meet the resonant wave condition. In yet another example, the apparatus 100 may be configured to meet both the standing wave condition and the resonant wave condition.

In the example shown, the input clock (e.g., CLK_M) may be input at the termination point 110c. Generally, the input clock may be input from any of the termination points 110a-110l (e.g., either at the center or the edge of the mesh network 112). The total inductors 150a-150l and/or the values of the inductors 150a-150l may be calculated and/or used for resonant clock frequency if the resonant clock frequency condition is added. The location on the input clock may be varied according to the design criteria of a particular implementation.

Figure 6:
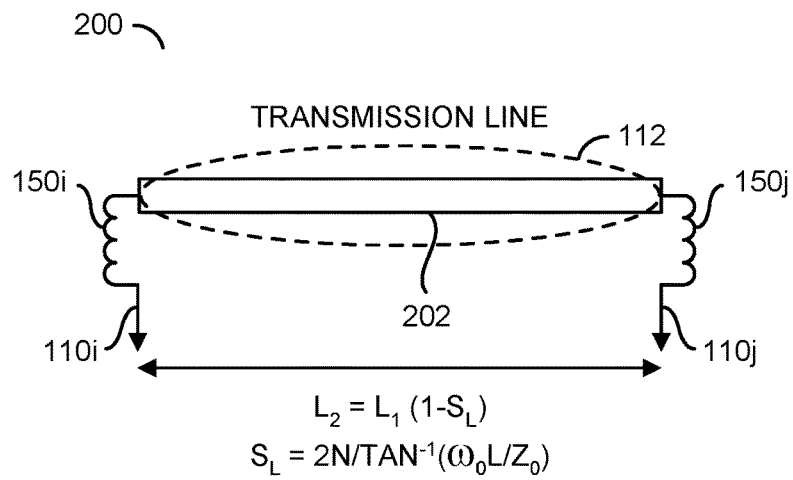
FIG. 6 is a block diagram illustrating a model of a transmission line implementing inductor termination.

Referring to FIG. 6, is a block diagram illustrating a model 200 of a transmission line implementing inductor termination is shown. Connections between the termination points 110a-110n on the clock mesh network 112 may be modeled as a transmission line. An example transmission line 202 is shown as part of the clock mesh network 112. In the example shown, the transmission line 202 may be an example transmission line between the termination point 110i and the termination point 110j. The inductor 150i is shown at the termination point 110i. The inductor 150j is shown at the termination point 110j.

In an example transmission line that does not implement the inductors 150a-150n, the termination points 110a-110n may be grounded (e.g., grounded termination). To implement the standing wave condition with grounded termination, the length of the transmission line 202 may be defined by an equation (e.g., EQ1):

$$\text{Len1} = \lambda/2 \tag{EQ1}$$

where $\lambda$ represents the wavelength of the clock signal (e.g., $\lambda = c/f_0$).

With grounded termination, the length of the transmission line 202 may be half of the wavelength the clock signal to meet the standing wave condition. In one example, with a 4 GHz clock frequency, the clock signal CLK_M may have a wavelength of 75 mm and the transmission line 202 may be 37.5 mm to meet the standing wave condition with grounded termination. In another example, with a 6 GHz clock frequency, the clock signal CLK_M may have a wavelength of 50 mm and the transmission line 202 may be 25 mm to meet the standing wave condition with grounded termination. In yet another example, with a 10 GHz clock frequency, the clock signal CLK_M may have a wavelength of 30 mm and the transmission line 202 may be 15 mm to meet the standing wave condition with grounded termination. Even with a clock speed of approximately 10 GHz, routing the 15 mm transmission line length may not be practical with grounded termination within the chip size constraints (e.g., less than 5 mm×5 mm) for the RCD 74 and/or the data buffers 70a-70n). The DDR5 memory modules 50a-50 may operate at frequencies less than 8.8 GHz.

To solve the issue of the length of the transmission line 202, the apparatus 100 may implement inductor termination (shown as the inductor 150i and the inductor 150j). Inductor termination may enable the length of the transmission line 202 to be shortened while still meeting the standing wave condition. For example, the length of the transmission line 202 may be shortened to meet the constraint of the chip size of the RCD 74 and/or the data buffers 70a-70n. The length of the transmission line 202 when inductor termination is implemented may be determined according to an equation (e.g., EQ2):

$$\text{Len2} = \text{Len1}(1-SL) \tag{EQ2}$$

where SL is determined by an equation (e.g., EQ3):

$$SL = (2/\pi)\tan^{-1}(\omega_0 L/Z_0) \tag{EQ3}$$

where $\omega_0 = 2\pi f_0 = 2\pi c/\lambda$.

Using inductor termination, the length of the transmission line 202 may be reduced by a factor of SL compared to grounded termination. With the inductor termination implemented by the apparatus 100, the inductor (e.g., the inductor 150$i$ and/or the inductor 150$j$ in the example shown) to compensate. The termination length may be set to meet the constraints of the physical dimension of the chip (e.g., the RCD 74 and/or the data buffers 70$a$-70$n$).

Generally, the inductor termination modulates the length (e.g., Len2) of the transmission line. In one example, when $f_0$ is equal to 2 GHz, the length of the transmission line can be reduced from 150 mm to 18.8 mm with an inductor value of 3.95 nH. In another example, when $f_0$ is equal to 4 GHz, the length of the transmission line can be reduced from 75 mm to 18.8 mm with an inductor value of 1.98 nH. Implementing the standing wave and/or resonant wave clocking architecture 100 may enable a standing wave condition with the length Len2 less than 1 mm for the data buffers 70$a$-70$n$ and/or the RCD 74.

Example values for SL and Len2 (e.g., corrected transmission line length) for frequencies of $f_0$ from 2-60 GHz with an inductor value L of 2.5 nH and the impedance value $Z_0$ equal to 50 Ohms may be shown in association with Table 1:

TABLE 1

| $f_0$ (GHz) | λ (mm) | $\omega_0$ | Len1 (mm) | SL | Len2 (mm) |
|---|---|---|---|---|---|
| 2 | 150 | 1.26e10 | 75 | 0.3572 | 48.2124 |
| 4 | 75 | 2.51e10 | 37.5 | 0.5722 | 16.0416 |
| 6 | 50 | 3.77e10 | 25 | 0.6897 | 7.7576 |
| 10 | 30 | 6.28e10 | 15 | 0.8041 | 2.9381 |
| 30 | 10 | 1.88e11 | 5 | 0.9331 | 0.3343 |
| 60 | 5 | 377e11 | 2.5 | 0.9667 | 0.0832 |

Example values for SL and Len2 (e.g., corrected transmission line length) for inductor values L from 1-10 nH with the frequency $f_0$ equal to 2 GHz and 4 GHz and the impedance value $Z_0$ equal to 50 Ohms may be shown in association with Table 2:

TABLE 2

| | $f_0$ = 2 GHz | | $f_0$ = 4 GHz | |
|---|---|---|---|---|
| L (nH) | SL | Len2 (mm) | SL | Len2 (mm) |
| 1 | 0.1568 | 63.24 | 0.2965 | 26.38 |
| 1.5 | 0.2295 | 57.78 | 0.4113 | 22.07 |
| 1.98 | 0.2940 | 52.95 | 0.4986 | 18.80 |
| 2 | 0.2965 | 52.76 | 0.5018 | 18.68 |
| 3 | 0.4113 | 44.15 | 0.6274 | 13.97 |
| 3.95 | 0.4978 | 18.83 | 0.7032 | 11.13 |
| 5 | 0.5722 | 32.08 | 0.7592 | 9.03 |
| 10 | 0.7592 | 18.06 | 0.8754 | 4.67 |

The examples shown in Table 1 and Table 2 may be illustrative and/or not reflect actual values implemented by the circuit 100. Values implemented by the circuit 100 may be determined based on components implemented and/or circuit characteristics of the data buffers 70$a$-70$n$ and/or the RCD 74. The values (e.g., frequencies, inductor values, lengths, etc.) may be varied according to the design criteria of a particular implementation.

The transmission line 202 may enable the timing signals (e.g., the signal CLK_M) to go to half phase and reflect to hit the termination points 110$i$-110$j$ and have another cycle. The waves may be synchronized and/or in phase. When the waves are in phase, the standing wave condition may be met. Generally, waves may be in phase at half the wavelength. The apparatus 100 may enable the length of the transmission line 112 to be reduced to enable the standing wave condition to be met within the constraints of the physical dimensions of the chip package. Introducing the inductors 150$a$-150$n$ may change the phase of the timing signals. The phase may determine the channel length, channel frequency and/or the impedance of the termination points 110$a$-110$n$.

The apparatus 100 may be configured to reduce the length of the transmission line 112 from the length Len1 (e.g., half the wavelength). The apparatus 100 may enable SL modulation. The mirror lengths of the transmission line 202 may be modulated by SL. For example, a designer may calculate the value Len2 for the case of a 2.5 mm physical dimension of the chip package to determine the amount of inductance to add.

In some embodiments, different waveforms may be implemented by the apparatus 100. In one example, the timing signals may be a square wave with the clock mesh network 112 implemented in the middle of the chip package (e.g., the data buffers 70$a$-70$n$ and/or the RCD 74). For example, four terminals (e.g., the termination points 110$a$-110$n$) may be implemented at the four corners of the chip package to deliver the timing signals to the components 154 at each corner. With the termination points 110$a$-110$n$ implemented at the four corners, all the transmission line lengths, die area and/or characteristics of the clock mesh network 112 may be known. A designer may calculate values for the inductors 150$a$-150$n$ to meet the standing wave condition. The standing wave condition may reduce an amount of loss on the transmission line 112. In embodiments where the memory modules 50$a$-50$n$ implement DDR4 technology, the timing signals may be input from the edge of the chip package. In embodiments where the memory modules 50$a$-50$n$ implement DDR5 technology, the timing signals may be input from the middle of the chip package.

Implementing the standing wave condition using the apparatus 100 may reduce a length of the transmission line 202 and/or improve jitter performance (e.g., when compared to grounded termination). The inductor (e.g., the inductor 150$j$) may be implemented at the end of the transmission line 202 to meet the standing wave condition. Additionally, the transmission line 202 may be configured to meet the resonant wave clocking condition (e.g., by additionally implementing an inductor at the clock source such as the inductor 150$i$).

Figure 7:
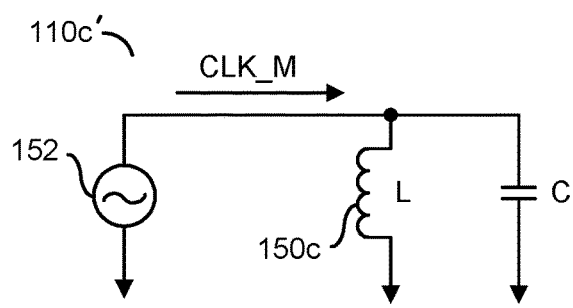
FIG. 7 is a diagram illustrating a model of a LC tank circuit.

Referring to FIG. 7, a diagram illustrating a model of a LC tank circuit is shown. In an example, the LC tank circuit may be the termination point 110$c'$. The termination point 110$c'$ may comprise the clock source 152 (e.g., a current source), the inductor 150$c$ (e.g., having a value of L) and a capacitor (e.g., C). In an example, the clock source 152 may deliver the signal CLK_M to clock mesh network 112 (e.g., from the top node of the termination point 110$c'$).

By implementing the inductor 150$c$ at the termination point 110$c'$, the circuit may become a LC tank. The value C may represent a capacitance of the clock mesh 112. The LC tank may pass the signal from the capacitor to the inductor to create a magnetic field. When the charge of the capacitor reaches zero, the flow of current may reverse (e.g., power shifts from the inductor to the capacitor and the magnetic field may dissipate). The LC tank may be resonant at a frequency defined by an equation (e.g., EQ4):

$$f = 1/\sqrt{2\pi LC} \qquad (EQ4)$$

When the resonant wave condition is met, the apparatus 100 may generate higher voltages and/or current than received (e.g., the internal voltage of the apparatus 100 may be higher than the input voltage). In an example, the apparatus 100 may be configured such that the series impedance is at a minimum and/or a parallel impedance is at a maximum. The resonant frequency may be determined based on values of the inductor L and/or the capacitor C.

Figure 8:
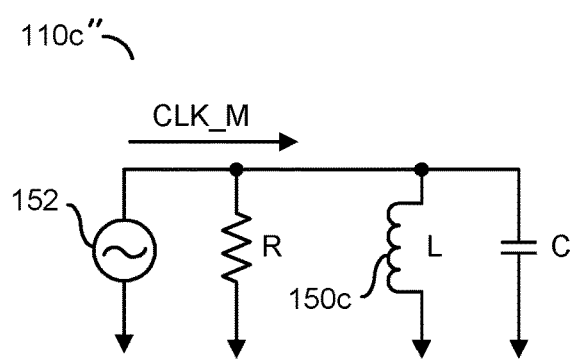
FIG. 8 is a diagram illustrating a model of a RLC circuit with a parasitic line resistor.

Referring to FIG. 8, a diagram illustrating a model of a RLC circuit with a parasitic line resistor is shown. In an example, the RLC circuit may be the termination point 110c". The termination point 110c" may comprise the clock source 152 (e.g., a current source), a resistor (e.g., R), the inductor 150c (e.g., having a value of L) and a capacitor (e.g., C). In an example, the clock source 152 may deliver the signal CLK_M to clock mesh network 112.

In a circuit implementation, the resistance R may be a parasitic line resistor. The resonant clock may see an energy loss due to the resistor R. In a conventional implementation without the inductor 150c, the clock network with ground termination may result in a power loss caused by the resistance R (e.g., due to heat generated by the resistor R). The resistor R may burn power according to an equation (e.g., EQ5):

$$P\_Loss = \tfrac{1}{2} \ast I R^2 \qquad (EQ5)$$

The clock mesh 112 may be configured to deliver (e.g., transmit) the timing signals to the components 154 (e.g., every flip flop, drivers, etc.) from the center of the chip to all four corners of the die. In an example, the clock mesh 112 may deliver the timing signals over a distance of approximately 1.5 mm to 2 mm. In some embodiments, the clock mesh 112 may be modeled as a transmission line that acts as a RC network. The metal network of the clock mesh 112 may act as a delivery transmission line and/or a metal resistance. There may be a power loss due to the resistance R that may be unavoidable (e.g., metal resistance and/or gate resistance) throughout the clock mesh network 112. The power loss due to the resistance R may be converted to heat (e.g., heat generated on the die may be lost power). An amount of power and amplitude for the timing signals may be delivered to the chip and the assumption may be that some will be lost to heat from the resistance R.

The apparatus 100 configured to meet the resonant clock condition by implementing the inductor 150c at the termination point 110c" may see significant power savings on the clock mesh network 112. To meet the resonant clock condition, the value L of the inductor 150c may be selected based on the characteristics of the resistance(s) throughout the clock mesh network 112. In one example, a designer may simulate how much power will be consumed by the resistor(s). The parasitic resistor R may cause the resonant wave to decay over time unless the source (e.g., the clock input 152) is present.

The value L of the inductor 150c may be determined based on the value C of the capacitor. The inductor 150c may periodically store and release energy that would normally be dissipated through the clock mesh 112 (e.g., as waste heat energy). The LC oscillator may swing between two voltages to alternately store energy in the clock mesh 112 and/or the inductors 150a-150n. By implementing the apparatus 100, the inductor 150c may be intentionally introduced to the circuit 110c" to enable resonance at the frequency of the application. The value L of the inductor 150c may be calculated based on the input frequency (e.g., 4 GHz, 3.2 GHz, etc.). Generally, there is little control over what the value C of the capacitor may be for the clock mesh network 112. A designer implementing the apparatus 100 may analyze the layout to determine the capacitance and work back to calculate the value L of the inductor 150c.

The apparatus 100 may enable the termination point 110c" (implementing the input clock source 152) to resonate. In some embodiments, the resistance through the clock mesh network 112 may be improved along with the resonating input to improve the input energy and/or internally save the energy. In one example, implementing the resonant wave condition using the apparatus 100 may save 40%-50% of the amplitude of the input clock signal CLK_M.

Practically, a specific system may be associated with the clock mesh network 112. By tuning and/or analyzing the system, the apparatus 100 may resonate at the clocking frequency. The whole clock mesh network 112 may operate with the resonating clock.

Figure 9:
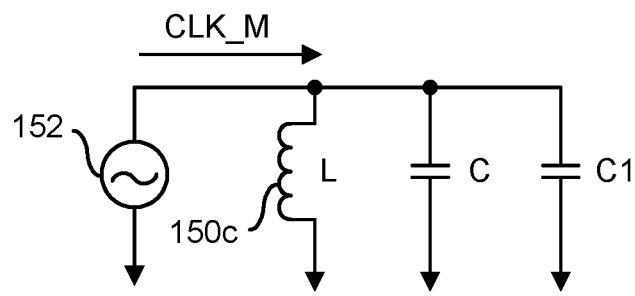
FIG. 9 is a diagram illustrating a model of a circuit configured to implement a standing wave condition and a resonant wave condition.

Referring to FIG. 9, a diagram illustrating a model of a circuit configured to implement a standing wave condition and a resonant wave condition is shown. In an example, the circuit implementing the standing wave condition and the resonant wave condition may be the termination point 110c'''. The termination point 110c''' may comprise the clock source 152 (e.g., a current source), the inductor 150c (e.g., having a value of L), a capacitor (e.g., C) and a capacitor (e.g., C1). In an example, the clock source 152 may deliver the signal CLK_M to clock mesh network 112.

The apparatus 100 may implement both the standing wave condition and/or the resonant wave condition (e.g., both implemented on the same chip such as the data buffers 70a-70n and/or the RCD 74). The termination used for the standing wave condition may be calculated (e.g., to determine the value of the inductor 150c). The calculation may further account for the resonant wave clock condition. In the example shown, the extra capacitor C1 may be added to meet the resonant clock condition at the frequency according to the equation EQ4.

Figure 10:
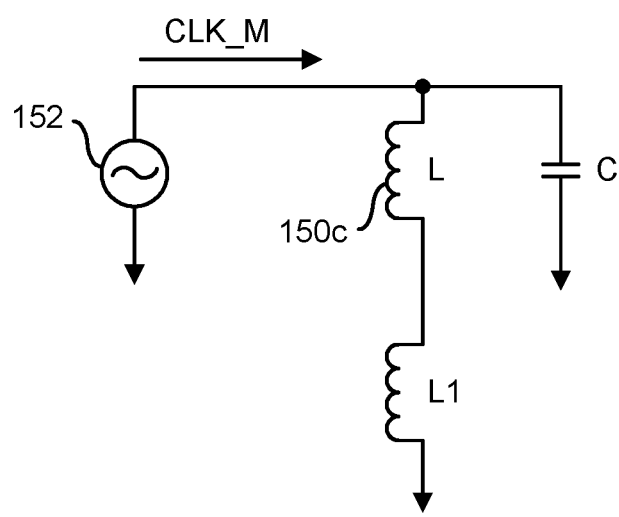
FIG. 10 is a diagram illustrating a model of an alternate circuit configured to implement a standing wave condition and a resonant wave condition.

Referring to FIG. 10, a diagram illustrating a model of an alternate embodiment of a circuit configured to implement a standing wave condition and a resonant wave condition is shown. In an example, the circuit implementing the standing wave condition and the resonant wave condition may be the termination point 110c''''. The termination point 110c'''' may comprise the clock source 152 (e.g., a current source), the inductor 150c (e.g., having a value of L), a capacitor (e.g., C) and an inductor (e.g., L1). In an example, the clock source 152 may deliver the signal CLK_M to clock mesh network 112.

Similar to the example shown in association with FIG. 9, apparatus 100 may implement both the standing wave condition and/or the resonant wave condition. The termination used for the standing wave condition may be calculated (e.g., to determine the value of the inductor 150c). The calculation may further account for the resonant wave clock condition. In the example shown, the extra inductor L1 may be added to meet the resonant clock condition at the frequency according to the equation EQ4.

In some embodiments, only one of the conditions (e.g., the standing wave condition or the resonant wave condition) may be implemented. Which of the conditions to satisfy may be determined based on a priority of design goals for the apparatus 100. In one example, if jitter reduction is a priority then the standing wave condition may be implemented. In another example, if power savings is a priority then the resonant wave condition may be implemented. Which of the conditions to implement in the apparatus 100 may be varied according to the design criteria of a particular implementation.

Figure 11:
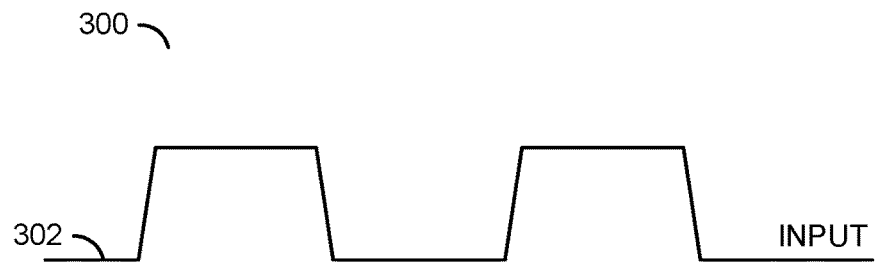
FIG. 11 is a diagram illustrating an input clock signal.

Referring to FIG. 11, a diagram 300 illustrating an input clock signal 302 is shown. The input clock signal 302 may be representative of one or more clock signals implemented by the apparatus 100. For example, the input clock signal 302 may represent one or more input clock signals implemented by the data buffers 70a-70n and/or the RCD 74. In another example, the input clock signal 302 may represent the signal CLK_M.

In some embodiments, the apparatus 100 may receive the input clock signal. The apparatus 100 may be configured to make the input clock signal resonating. Once the input clock signal is resonating, the amplitude of the input clock may be reduced. For example, by reducing the input clock after the apparatus 100 enables the resonate wave condition, the power may be reduced (e.g., by approximately 50%).

Figure 12:
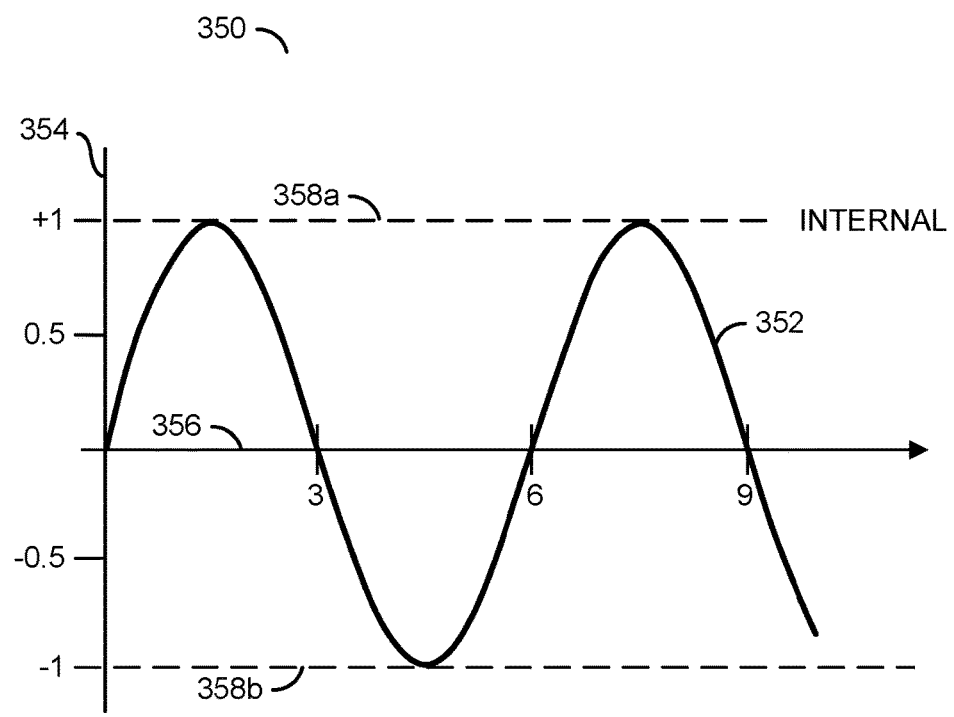
FIG. 12 is a diagram illustrating an internal signal.

Referring to FIG. 12, is a diagram 350 illustrating an internal signal 350 is shown. The internal signal 350 may represent an internal signal implemented within the data buffers 70a-70n and/or the RCD 74 before the apparatus 100 is resonating. An axis 354 is shown. The axis 354 may represent a Y axis (signal amplitude). An axis 356 is shown. The axis 356 may represent a X axis (e.g., time).

Lines 358a-358b are shown. The lines 358a-358b may correspond to a maximum positive and maximum negative amplitude of the signal 352. In the example shown, the input signal 352 may have an amplitude with an absolute value of 1V. Once the input clock signal 302 is received, the internal signal 352 may be generated (e.g., throughout the clock mesh network 112). The signal 352 may be the initial condition to enable the apparatus 100 to establish the resonating wave condition. Once the apparatus 100 is resonating, the amplitude of the signal 352 may be reduced.

Figure 13:
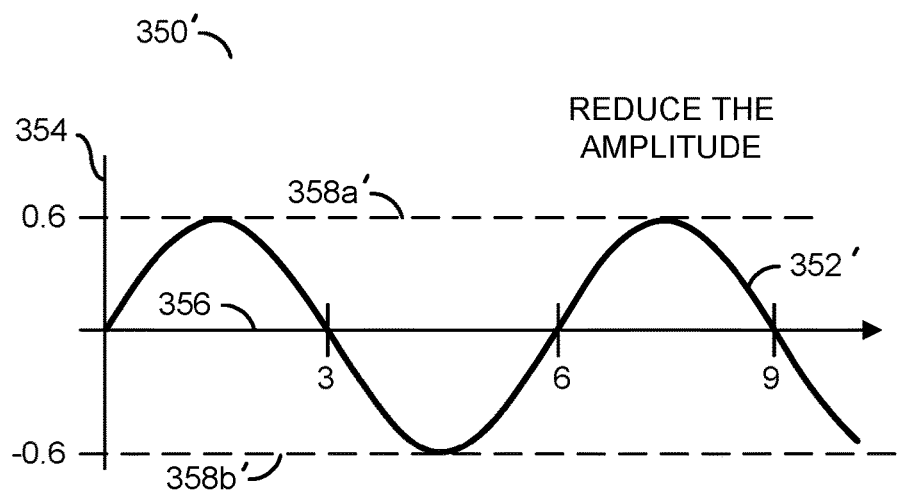
FIG. 13 is a diagram illustrating an internal signal with a reduced amplitude.

Referring to FIG. 13, a diagram 350' illustrating the internal signal 352' with a reduced amplitude is shown. The internal signal 353' may represent an internal signal implemented within the data buffers 70a-70n and/or the RCD when inductor termination is used (e.g., to establish the resonating clock wave condition). For example, the inductors 150a-150n may be implemented at the termination points 110a-110n. The Y axis 354 is shown. The X axis 356 is shown.

Lines 358a'-358b' are shown. The lines 358a'-358b' may correspond to a maximum positive and maximum negative amplitude of the signal 352'. In the example shown, with inductor termination, the internal signal 352' may have an amplitude with an absolute value of 600 mV. The apparatus 100 may enable the input clock amplitude to be reduced to compensate for the loss due to the resistor R. The clock amplitude is to make the clock signal in a full swing (e.g., from 0 to VDD) with the resonant circuit.

The signal 352 with the amplitude of approximately 1V may be received. After the signal 352 is received, the apparatus 100 may establish the resonant wave condition. The amplitude of the input signal may be reduced (e.g., the reduced amplitude signal 352'). The signal 352' may be reduced to keep the apparatus 100 resonating (e.g., the signal 352' may provide a push for the resonating system). Once the apparatus 100 is resonating, the reduced amplitude of the signal 352' may result in a reduced power consumption (e.g., approximately a reduction in power by half).

Figure 14:
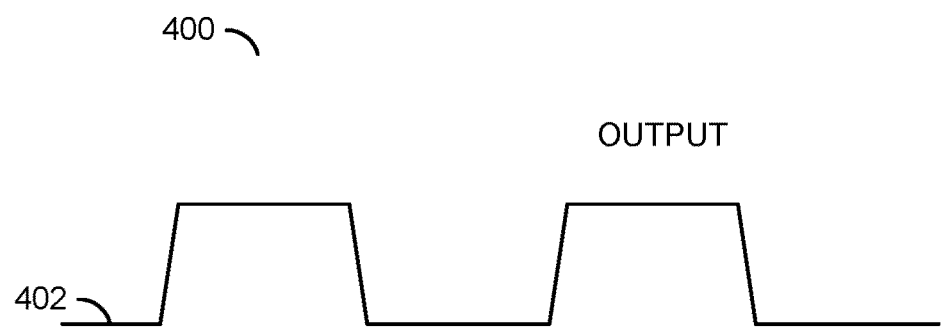
FIG. 14 is a diagram illustrating an output clock signal.

Referring to FIG. 14, a diagram 400 illustrating an output clock signal 402 is shown. The output clock signal 402 may be representative of one or more clock signals implemented by the apparatus 100. For example, the output clock signal 402 may represent one or more output clock signals implemented by the data buffers 70a-70n and/or the RCD 74. In another example, the input clock signal 402 may represent the signal CLK_M.

The resonant frequency may be wide but not too sharp and/or a Hi-Q circuit so the circuit is not too sensitive to the resonant frequency (e.g., the clock frequency). In some embodiments, the resonant frequency may be a peak value, unless the timing signal is very sharp and a Hi-Q resonant circuit may be implemented. Generally, the resonating timing signal may have a bit of shoulder on the waveform. However, if there is a small amount of inductor mismatch there may be some offset but power savings still may be achieved without degrading performance. In one example, being within a 10% range from the target frequency may enable power savings without degrading performance. Operating within the range may enable implementation of the apparatus 100 that balances design complexity and performance.

The apparatus 100 may be configured to generate the output clock signal 402 that has similar characteristics to the input clock signal 302 shown in association with FIG. 11. The apparatus 100 may be configured to generate the output clock signal 402 by using less power (e.g., the reduced amplitude internal signal 350' shown in association with FIG. 13). By reducing the amount of power used to generate the output clock signal 402, while still maintaining the characteristics of the input clock signal 302, the clock mesh 112 may efficiently transmit the clock signal(s) from the input to the output (e.g., from the clock source 152 to one or more of the components 154).

The apparatus 100 may implement a transmission line with inductor termination. In some embodiments, (e.g., the data buffers 70a-70n and/or the RCD 74), there may be two clock signals (e.g., SCLK and MCLK). Two of the mesh networks 112 may be implemented. In one example, the two mesh networks 112 may be implemented in a side by side structure. In another example, the two mesh networks 112 may be implemented in an up-down structure. By implementing inductor termination, the transmission line may be reduced to meet the physical dimensions of the microchip package.

In some embodiments, the power used for distributing the clock signal(s) in the memory modules 50a-50n may consume approximately 30% of the power. The clock mesh 112 may enable the apparatus 100 to distribute the clock signal(s) widely, reduce variations in timing (e.g., skew) due to different wire lengths and/or enable chips to run at higher frequencies. Implementing the resonant wave condition may enable the apparatus 100 to drive the clock mesh network 112 to distribute the clock signal(s) using less power. For example, the clock generator 152 may be configured to input a small amount of energy on each cycle to keep the oscillating circuit operating (e.g., to counteract the parasitic resistance R).

Generally, without the apparatus 100, for the data buffers 70a-70n and/or the RCD 74 the clock scheme may be responsible for approximately 10%-15% of the power consumption. In one example not implementing the apparatus 100, the RCD 74 may consume approximately 400 mW-500 mW with approximately 40 mW-50 mW consumed by the clock scheme. In another example not implementing the apparatus 100, the data buffers 70a-70n may each consume approximately 250 mW with approximately 25 mW-30 mW consumed by the clock scheme. The apparatus 100 may reduce the amount of power consumed due to the clock scheme to meet a power target.

The resonant wave condition may be implemented on an input side for the apparatus 100. From the clock mesh network 112, a total resistance value and a total capacitance value may be determined. From the total resistance and total capacitance, the value for the inductors 150a-150n may be calculated to meet the resonant wave condition.

On the output side, the length of the transmission line may be known based on the physical dimensions of the chip package and/or design criteria. Based on the total resistance and total capacitance (e.g., the characteristics of the clock mesh network 112), the value of the inductors 150a-150n may be calculated to meet the desired length of the transmission line 202 for the standing wave condition.

To combine both the standing wave condition and the resonant wave condition, once the value for the termination points 110a-110n have been calculated to meet the standing wave condition, a value of the contribution of the inductance added to meet the resonant wave condition may be calculated for the clock mesh network 112. The inductance from the resonant wave condition may reduce the amount of inductance used to meet the standing wave condition. For example, once the inductor value L is introduced to meet the resonant wave condition, the inductor value L may further contribute to the characteristics of the clock mesh network 112 (e.g., the inductor value L may no longer be merely an input inductor).

The apparatus 100 may be configured to implement at least one condition. The condition may be the standing wave condition and/or the resonant wave condition. In some embodiments, only the standing wave condition may be implemented by the apparatus 100. In some embodiments, only the resonant wave condition may be implemented by the apparatus 100. In some embodiments, both the standing wave condition and the resonant wave condition may be implemented. The condition may be based on the signal and/or waveform characteristics of the timing signals.

The characteristics of the timing signals may be tuned in response to the characteristics of the clock mesh network 112. The condition may comprise the amount of jitter, duty cycle variation, skew, noise, power consumption and/or spurs on the timing signals. The condition may comprise the peaks of the waveform of the timing signals being spatially aligned (e.g., constant phase). For example, the condition may be when the waveform reflected back is in phase with the incident waveform (e.g., constructive interference). The condition may comprise the waveform oscillating at a resonant frequency. For example, the condition may be when the timing signal recycles power between an inductor termination and a capacitance.

Although embodiments of the invention have been described in the context of a DDR4 or DDR5 application, the present invention is not limited to DDR4 or DDR5 applications, but may also be applied in other high data rate digital communication applications where different transmission line effects, cross-coupling effects, traveling wave distortions, phase changes, impedance mismatches and/or line imbalances may exist. The present invention addresses concerns related to high speed communications, flexible clocking structures, specified command sets and lossy transmission lines. Future generations of DDR can be expected to provide increasing speed, more flexibility, additional commands and different propagation characteristics. The present invention may also be applicable to memory systems implemented in compliance with either existing (legacy) memory specifications or future memory specifications.

The functions and structures illustrated in the diagrams of FIGS. 1 to 14 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
    a plurality of termination points configured to send/receive timing signals, each of said plurality of termination points comprising an inductor; and
    a clock mesh network configured to (a) provide a path to transmit said timing signals from a clock source to a plurality of components and (b) implement a condition using said inductors, wherein (i) said inductors for each of said plurality of termination points are implemented to meet said condition, (ii) values for said inductors are determined based on characteristics of said clock mesh network and (iii) said condition prevents power loss.

2. The apparatus according to claim 1, wherein apparatus is implemented as part of a memory interface.

3. The apparatus according to claim 2, wherein said memory interface is part of at least one of a DDR4 memory module and a DDR5 memory module.

4. The apparatus according to claim 2, wherein said apparatus is implemented in at least one of a (i) data buffer circuit and (ii) register clock driver circuit.

5. The apparatus according to claim 1, wherein said condition is a standing wave condition within a physical dimension constraint of a chip.

6. The apparatus according to claim 5, wherein said condition further comprises a resonant wave condition.

7. The apparatus according to claim 6, wherein (i) a first value for a first of said inductors is determined to meet said resonant wave condition, (ii) a contribution of said first value to said characteristics of said clock mesh network is determined and (iii) said values for said inductors are determined to meet said standing wave condition.

8. The apparatus according to claim 5, wherein said standing wave condition prevents jitter for said timing signals.

9. The apparatus according to claim 5, wherein (i) an a frequency of said timing signals results in a transmission line that is too long for said physical dimension constraint of said chip and (ii) implementing said inductors reduces a length of said transmission line for meeting said standing wave condition.

10. The apparatus according to claim 9, wherein said length of said transmission line is reduced by a factor of $(2/\pi)\tan^{-1}(\omega_0 L/Z_0)$.

11. The apparatus according to claim 1, wherein said condition is a resonant wave condition.

12. The apparatus according to claim 11, wherein said values for said inductors are based on an LC tank oscillation center frequency for said clock mesh.

13. The apparatus according to claim 12, wherein said LC tank oscillation center frequency is $1/\sqrt{2\pi LC}$.

14. The apparatus according to claim 11, wherein an amplitude of said timing signal is reduced after said resonant wave condition is met.

15. The apparatus according to claim 14, wherein said amplitude is reduced by 40%.

* * * * *